(12) United States Patent
Bauer et al.

(10) Patent No.: US 10,388,829 B2
(45) Date of Patent: Aug. 20, 2019

(54) RADIATION-EMITTING SEMICONDUCTOR DEVICE

(71) Applicant: OSRAM Opto Semiconductors GmbH, Regensburg (DE)

(72) Inventors: Adam Bauer, Donaustauf (DE); Andreas Loeffler, Neutraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/566,678

(22) PCT Filed: Apr. 13, 2016

(86) PCT No.: PCT/EP2016/058112
§ 371 (c)(1),
(2) Date: Oct. 13, 2017

(87) PCT Pub. No.: WO2016/166154
PCT Pub. Date: Oct. 20, 2016

(65) Prior Publication Data
US 2018/0097146 A1    Apr. 5, 2018

(30) Foreign Application Priority Data
Apr. 14, 2015   (DE) .................. 10 2015 105 693

(51) Int. Cl.
*H01L 33/04*    (2010.01)
*H01L 33/06*    (2010.01)
(Continued)

(52) U.S. Cl.
CPC .............. *H01L 33/08* (2013.01); *H01L 33/06* (2013.01); *H01L 33/502* (2013.01); *H01L 33/04* (2013.01)

(58) Field of Classification Search
CPC ....... H01L 33/04–06; H01L 33/50–508; H01L 33/08
See application file for complete search history.

(56) References Cited

U.S. PATENT DOCUMENTS

| 7,402,831 B2 | 7/2008 | Miller et al. |
| 2007/0069223 A1 | 3/2007 | Chen et al. |
| (Continued) | | |

FOREIGN PATENT DOCUMENTS

| DE | 102009023351 A1 | 12/2010 |
| JP | 2001274462 A | 10/2001 |
| NO | 2007146861 A1 | 12/2007 |

OTHER PUBLICATIONS

X. Guo et al.: "Photon Recycling Semiconductor Light Emitting Diode" Electron Devices Meeting, 1999, IEDM Technical Digest, International, Washington, DC, USA, Dec. 5-8, 1999, Piscataway, NJ, USA, IEEE, US, Dec. 5, 1999, pp. 600-603.

*Primary Examiner* — Amar Movva
(74) *Attorney, Agent, or Firm* — McDermott Will & Emery LLP

(57) ABSTRACT

The invention describes a radiation-emitting semiconductor component (100) having a first semiconductor layer sequence (10) which is designed to generate radiation of a first wavelength, a second semiconductor layer sequence (20), a first electrode area (1) and a second electrode area (2). It is provided that the second semiconductor layer sequence (20) has a quantum pot structure (21) with a quantum layer structure (22) and a barrier layer structure (23) and is designed to generate incoherent radiation of a second wavelength by means of absorption of the radiation of the first wavelength, and an electric field can be generated in the second semiconductor layer sequence (20) by the first electrode area (1) and the second electrode area (2).

21 Claims, 2 Drawing Sheets

(51) Int. Cl.
*H01L 33/08* (2010.01)
*H01L 33/50* (2010.01)

(56) References Cited

U.S. PATENT DOCUMENTS

| | | |
|---|---|---|
| 2008/0204383 A1 | 8/2008 | McCarthy et al. |
| 2010/0283074 A1 | 11/2010 | Kelley et al. |
| 2011/0150019 A1 | 6/2011 | Leatherdale et al. |
| 2012/0292650 A1 | 11/2012 | Sugiyama et al. |

RADIATION-EMITTING SEMICONDUCTOR DEVICE

SUMMARY

A radiation-emitting semiconductor device is described.

This patent application claims the priority of German patent application 102015105693.3, the disclosure content of which is hereby incorporated by reference.

In conventional light-emitting diodes, there is a possibility to generate colored radiation in that radiation of a first wavelength is generated by a semiconductor device, said radiation subsequently being converted into radiation of a second wavelength by means of a luminescent material. A disadvantage of this solution is the relatively large spectral full width at half maximum of the generated radiation which can be e.g. in the region of approximately 100 nm.

Moreover, in all solutions relating to wavelength conversion, there is a difficulty in that the wavelength of the converted radiation is clearly dependent upon the operating current and the temperature in the semiconductor device.

An object resides in providing a semiconductor device which generates wavelength-converted radiation having a small full width at half maximum. In particular, the object resides in providing a semiconductor device, the converted radiation of which has a wavelength which has a low dependence upon the operating current and the temperature of the semiconductor device.

This object is achieved by a semiconductor device having the features of claim 1 and a method according to claim 14. Preferred embodiments and developments are described in the dependent claims.

The radiation-emitting semiconductor device comprises a first semiconductor layer sequence, a second semiconductor layer sequence, a first electrode surface and a second electrode surface. The first electrode surface is arranged between the first semiconductor layer sequence and the second semiconductor layer sequence. Moreover, the second semiconductor layer sequence is arranged between the first electrode surface and the second electrode surface.

The first semiconductor layer sequence includes a first semiconductor layer, a second semiconductor layer and an active region arranged between the first semiconductor layer and the second semiconductor layer, said active region being designed to generate radiation of a first wavelength. Preferably, the radiation of the first wavelength generated by the active region is incoherent.

The second semiconductor layer sequence comprises a quantum well structure having a quantum layer structure and a barrier layer structure and is designed to generate incoherent radiation of a second wavelength by absorbing the radiation of the first wavelength, in particular in the quantum well structure, i.e. for example in the quantum layer structure or in the barrier layer structure.

An electrical field can be generated in the second semiconductor layer sequence by the first electrode surface and the second electrode surface.

In the present context, the term quantum well structure includes in particular any structure in which charge carriers can undergo quantization of their energy states by way of confinement. In particular, the term quantum well structure contains no indication as to the dimensionality of the quantization. It thus includes inter alia quantum troughs, quantum wires and quantum dots and any combination of these structures.

In case of doubt, the term "active region" is to be understood in the present case to mean a radiation-generating layer which can be electrically excited. In contrast, the second semiconductor layer sequence, which acts as a re-emission layer, is optically pumped and is preferably electrically inactive during operation.

By virtue of the fact that an electrical field can be generated in the second semiconductor layer sequence by the first electrode surface and the second electrode surface, the wavelength of the converted radiation can be adapted during operation of the semiconductor device. In particular, the effects of the operating current flowing through the first semiconductor layer sequence and of the temperature of the semiconductor device can be compensated for.

The wavelength of the converted radiation can be adapted e.g. by distorting the energy bands in the quantum layer structure as a result of the quantum-confined Stark effect (QCSE). The QCSE describes the displacement and deformation of the wave functions in quantum layers under the effect of an external electrical field, which inter alia result in a reduction in the probability of a recombination in the quantum layer and a change, e.g. a decrease, in the wavelength of the radiation generated after a recombination.

According to one embodiment of the semiconductor device, the barrier layer structure comprises one or a plurality of barrier layers. Accordingly, the quantum layer structure can also comprise one or a plurality of quantum layers. The barrier layers and the quantum layers are preferably arranged in an alternating manner. An alternating arrangement means in other words that in the sequence of barrier layers and quantum layers, a barrier layer follows a quantum layer in each case, and vice-versa.

The quantum well structure can thus be designed as a single quantum well structure (SQW) or a multiple quantum well structure (MQW), wherein the quantum well(s) is/are each formed by a quantum layer between two adjoining barrier layers.

According to one embodiment of the semiconductor device, the radiation of the second wavelength is generated in the quantum layer structure, i.e. for instance in the quantum layer(s). The optional spatial separation of absorption of the radiation of the first wavelength and generation of the radiation of the second wavelength has the advantage of the radiation-emitting semiconductor device being more efficient.

In particular, the barrier layers are generally substantially thicker than the quantum layers which means that the absorption of the radiation of the first wavelength is substantially higher in the barrier layers and thus overall the excitation of the second semiconductor layer sequence may be substantially more efficient than in the case of absorption of the radiation of the first wavelength in the quantum layer structure or the corresponding quantum layers.

According to one embodiment, the radiation-emitting semiconductor device (in particular the first and/or second semiconductor layer sequence) is based on a compound semiconductor material, more preferably on a nitride compound semiconductor material or a phosphide compound semiconductor material. These semiconductor materials are characterized by a particularly efficient generation of radiation.

In the present context, "based on nitride compound semiconductors" means that the semiconductor device, preferably the active region and/or the second semiconductor layer sequence or at least a partial layer thereof, contains a nitride III-V compound semiconductor material, preferably $Al_nGa_mIn_{1-n-m}N$, where $0 \leq n \leq 1$, $0 \leq m \leq 1$ and $n+m \leq 1$, preferably where $n \neq 0$ and/or $m \neq 0$. This material does not absolutely have to comprise a mathematically exact composition according to the above formula. Instead, it may comprise one or more dopants and additional constituents which do not substantially modify the characteristic physical properties of the $Al_nGa_mIn_{1-n-m}N$ material. For the sake of simplicity, however, the above formula includes only the essential constituents of the crystal lattice (Al, Ga, In, N), even if these may in part be replaced by small quantities of further substances.

In this context, "based on phosphide compound semiconductors" means that the semiconductor device, preferably the active region and/or the second semiconductor layer sequence or at least a partial layer thereof, contains a phosphide III-V compound semiconductor material, preferably $Al_nGa_mIn_{1-n-m}P$, where $0 \leq n \leq 1$, $0 \leq m \leq 1$ and $n+m \leq 1$, preferably where $n \neq 0$ and/or $m \neq 0$. This material does not absolutely have to comprise a mathematically exact composition according to the above formula. Instead, it may comprise one or more dopants and additional constituents which do not substantially modify the physical properties of the material. For the sake of simplicity, however, the above formula includes only the essential constituents of the crystal lattice (Al, Ga, In, P), even if these may in part be replaced by small quantities of further substances.

According to one embodiment of the semiconductor device, the radiation of the first wavelength is only partially converted into radiation of the second wavelength in the second semiconductor layer sequence such that the semiconductor device is used for the simultaneous emission of radiation of the first wavelength and radiation of the second wavelength.

According to an alternative embodiment of the semiconductor device, provision can also be made that the radiation of the first wavelength is substantially completely converted into radiation of the second wavelength in the second semiconductor layer sequence such that the radiation-emitting semiconductor device thus only emits radiation of the second wavelength during operation. For example, provision can be made that the active region generates ultraviolet or blue radiation (e.g. with a wavelength between 440 nm and 470 nm inclusive) which is completely converted into radiation of a second wavelength in the visible spectral range, e.g. in the green spectral range. In the case of a semiconductor device based on a nitride compound semiconductor material, the active region preferably contains InGaN.

The radiation-emitting semiconductor device can be designed as a thin-film semiconductor device which is free of a growth substrate used to form the two semiconductor layer sequences. Alternatively, the semiconductor device can also be provided with a substrate in the form of the growth substrate (also called an epitaxy substrate) which can be permeable for the generated radiation of the first and/or second wavelength.

According to one embodiment, provision is made that the radiation-emitting semiconductor device comprises a radiation exit surface and the second semiconductor layer sequence is arranged between the first semiconductor layer sequence and the radiation exit surface. This arrangement is particularly advantageous when the radiation generated by the first semiconductor layer sequence is to be completely converted into radiation of the second wavelength and/or when predominantly or exclusively radiation of the second wavelength is to pass through the radiation exit surface.

According to one embodiment, provision is made that the first electrode surface is transparent at least for radiation of the first wavelength. Moreover, the second electrode surface can be transparent at least for radiation of the second wavelength. For example, the first and/or the second electrode surface can contain or consist of a transparent conductive oxide (TCO).

According to one embodiment, provision is made that the second semiconductor layer sequence is electrically inactive during operation of the semiconductor device. This means in particular that no current flows through the second semiconductor layer sequence or that a current passing through the second semiconductor layer sequence is at least insufficient to generate electromagnetic radiation to a significant degree. In this way, the conversion efficiency of the semiconductor device is increased.

According to one embodiment, provision is made that the first electrode surface or the second electrode surface is electrically insulated from the second semiconductor layer sequence. Alternatively or in addition, means for limiting a current flowing through the second semiconductor layer sequence can be provided between the first electrode surface and the second electrode surface, e.g. one or more current barrier layers. These measures ensure that the second semiconductor layer sequence is electrically inactive as desired during operation of the semiconductor device. The same effect can also be achieved or amplified e.g. by virtue of the fact that the second semiconductor layer sequence has a thickness of at least 300 nm, preferably at least 400 nm, in particular at least 500 nm and/or includes (preferably exclusively) layers consisting of undoped semiconductor material.

According to a further embodiment, provision is made that the first electrode surface and the second electrode surface each contain a doped semiconductor material and have different conductivity types.

According to a further embodiment, provision is made that the first semiconductor layer sequence and the second semiconductor layer sequence are integrated monolithically into the semiconductor device. This means in particular that the first semiconductor layer sequence and the second semiconductor layer sequence are grown on the same growth substrate. For example, the growth substrate can contain or consist of sapphire.

According to a further embodiment, provision is made that the second semiconductor layer sequence comprises a multiplicity of V defects on a surface facing the second electrode surface. In particular, the second semiconductor layer sequence comprises a higher density of V defects on the surface facing the second electrode surface than on a surface facing the first electrode surface or in a central region between said two surfaces. In the present case, the V defects act as coupling-out structures in the second semiconductor layer sequence and increase the coupling-out efficiency of the semiconductor device. The V defects are preferably filled with a doped semiconductor material.

In a semiconductor material such as e.g. in a nitride compound semiconductor material, a V defect is often in the shape of an open pyramid inverted in the growth direction, which has a hexagonal base for example. In cross-section, this defect is in the shape of a V. A V defect can be produced e.g. in a nitride compound semiconductor material—e.g. in a layer which is based on GaN or consists of this semiconductor material—by adjusting the growth parameters, in particular the growth temperature. The size of the V defect then depends upon the thickness of the layer in which it is produced. V defects are formed e.g. in the region of threading dislocations which occur e.g. in the case of the heteroepitaxy of a semiconductor material on a growth substrate which has a lattice constant different from that of the semiconductor material.

According to a further embodiment, provision is made that the second semiconductor layer of the first semiconductor layer sequence is connected to the first electrode surface in an electrically conductive manner. In this embodiment, typically three external contacts are sufficient for supplying electrical power to the semiconductor device. A first and a second contact are preferably each connected to the first and to the second semiconductor layer of the first semiconductor layer sequence in an electrically conductive manner and supply same with the operating current required for generating radiation of the first wavelength. Between the second contact, which is also connected to the first electrode surface in an electrically conductive manner, and a third contact electrically connected to the second electrode surface, a voltage can thus be applied to the second semiconductor layer sequence, said voltage being able to be used to modify the (second) wavelength of the radiation generated in the second semiconductor layer sequence.

According to a further embodiment, provision is made that the first semiconductor layer and the second semiconductor layer of the first semiconductor layer sequence are electrically insulated from the first electrode surface. In this embodiment, preferably four external contacts are provided for supplying electrical power to the semiconductor device, two contacts for supplying the first semiconductor layer sequence with the operating current required for generating radiation of the first wavelength, and two further contacts for applying a voltage to the second semiconductor layer sequence which can be used to modify the (second) wavelength of the radiation generated in the second semiconductor layer sequence.

According to a further embodiment, provision is made that the first semiconductor layer sequence and the second semiconductor layer sequence are attached to each other via a connecting element. This has the advantage that the first semiconductor layer sequence and the second semiconductor layer sequence can be formed separately from each other and subsequently characterized such that e.g. a check can be made as to whether the two semiconductor layer sequences are adapted to each other in relation to their optical properties.

A method for generating radiation using a radiation-emitting semiconductor device formed as discussed above comprises the following steps:
 generating radiation of a first wavelength in the first semiconductor layer sequence;
 at least partly absorbing the radiation of the first wavelength, in particular in the quantum well structure, i.e. for example in the quantum layer structure or in the barrier layer structure;
 generating incoherent radiation of a second wavelength in the quantum layer structure.

The second wavelength can be adjusted or adapted by way of a voltage applied between the first electrode surface and the second electrode surface. In particular, voltage can be controlled or regulated in dependence upon an operating current or a temperature of the semiconductor device. Alternatively, the voltage can be controlled or regulated such that the (second) wavelength remains substantially constant over time.

According to one embodiment, provision is made that the semiconductor device is operated such that the second semiconductor layer sequence is electrically inactive during operation of the semiconductor device. This means in particular that no current flows through the second semiconductor layer sequence or that a current passing through the second semiconductor layer sequence is at least insufficient to generate electromagnetic radiation to a significant degree. In this way, the conversion efficiency of the semiconductor device is increased.

According to a further embodiment, provision is made that a voltage is applied to the second semiconductor layer sequence, said voltage having a polarity such that charge carriers are removed from the first electrode surface and/or the second electrode surface. In the event that the first electrode surface and the second electrode surface each contain a doped semiconductor material and have different conductivity types, the voltage can be applied e.g. in a reverse direction so that no current at all, or only a very minor amount of current, flows through the second semiconductor layer sequence.

According to a further embodiment, provision is made that an electrical field active in the second semiconductor layer sequence during operation is directed opposite to an electrical field active in the first semiconductor layer sequence during operation.

According to a further embodiment, provision is made that the voltage applied between the first electrode surface and the second electrode surface is greater than 1 V, preferably greater than 2 V.

Further features, advantages and benefits of the invention will be apparent from the exemplified embodiments described hereinafter in conjunction with FIGS. 1 to 4.

DETAILED DESCRIPTION

Figure 1:
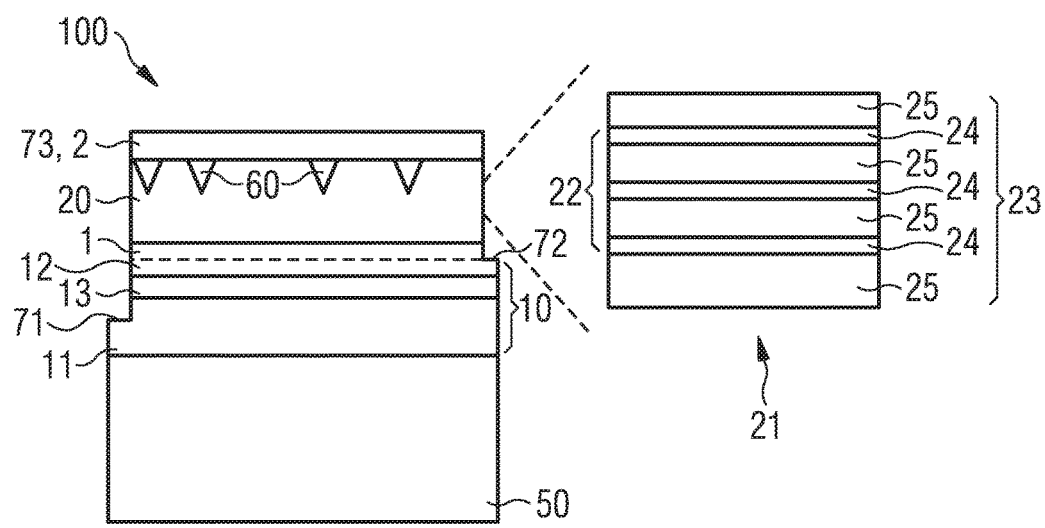
FIG. 1 shows a schematic sectional view of a first exemplified embodiment of the semiconductor device.

Identical elements or elements which act in an identical manner are provided with the same reference numerals in the figures.

FIG. 1 illustrates a radiation-emitting semiconductor device which is designated on the whole with numeral 100 and in which a first semiconductor layer sequence 10, a first electrode surface 1, a second semiconductor layer sequence 20 and a second electrode surface 2 are epitaxially grown on a growth substrate 50 made of sapphire. The first semiconductor layer sequence 10 includes a first semiconductor layer 11 consisting of n-GaN, a second semiconductor layer 12 consisting of p-GaN and an active region 13 which is based on InGaN, is arranged between the first semiconductor layer 11 and the second semiconductor layer 12 and can be designed for example as a single or multiple quantum well structure. The second semiconductor layer 12 and the first electrode 1 (in FIG. 1 illustrated separately as a dashed line) are formed by the same p-GaN layer in the present case.

During operation, radiation of a first wavelength $\lambda_1$ is generated in the active region 13. At least a portion of this radiation of the first wavelength $\lambda_1$ enters the second semiconductor layer sequence 20 which acts as a re-emission layer and partly or completely converts the radiation of the wavelength $\lambda_1$ into radiation of the wavelength $\lambda_2$.

As shown in the enlarged section of the second semiconductor layer sequence 20 in FIG. 1, said sequence comprises a quantum well structure 21 having a quantum layer structure 22 and a barrier layer structure 23. The quantum layer structure 22 includes a plurality of quantum layers 24. The barrier layer structure 23 includes a plurality of barrier layers 25 accordingly. In this case, the quantum well structure 21 is thus designed in the form of a multiple quantum well structure (MQW), wherein the quantum layers 24 and the barrier layers 25 are arranged in an alternating manner.

By dimensioning the quantum well structure 21 accordingly, the wavelength $\lambda_2$ of the radiation generated by the second semiconductor layer sequence can be predetermined.

The second semiconductor layer sequence 20 comprises, on a surface facing the second electrode surface 2, a multiplicity of V defects 60 which in the present case are produced by the growth of the quantum layers 24 and barrier layers 25. The V defects 60 are preferably filled with a doped semiconductor material, in the present case with n-GaN. The V defects 60 act as coupling-out structures in the second semiconductor layer sequence 20 and increase the coupling-out efficiency of the semiconductor device.

In the exemplified embodiment illustrated in FIG. 1, three external contacts 71, 72, 73 are provided for supplying the semiconductor device with electrical power. A first contact 71 and a second contact 72 are formed in regions in which the first semiconductor layer 11 consisting of n-GaN and respectively the second semiconductor layer 12 consisting of p-GaN are exposed, e.g. by an etching process, and can be contacted from the outside. A third contact 73 is formed in the region of the second electrode surface 2 consisting of n-GaN. A first voltage is applied between the second contact 72 and the first contact 71 during operation and is used to supply the first semiconductor layer sequence with the operating current required to generate radiation of the first wavelength. A second voltage is applied between the third contact 73 and the second contact 72 and can be used to modify the (second) wavelength of the radiation generated in the second semiconductor layer sequence.

If the first voltage and the second voltage have an identical polarity, that is to say if the second contact 72 is at a potential which is between the potential of the first contact 71 and that of the third contact 73, then a voltage is applied to the second semiconductor layer sequence 20 in a reverse direction so that no current at all, or only a very minor amount of current, flows through the second semiconductor layer sequence 20. In contrast, if the first voltage and the second voltage have an opposing polarity, then an electrical field active in the second semiconductor layer sequence 20 during operation is directed opposite to an electrical field active in the first semiconductor layer sequence 10 during operation.

Figure 2:
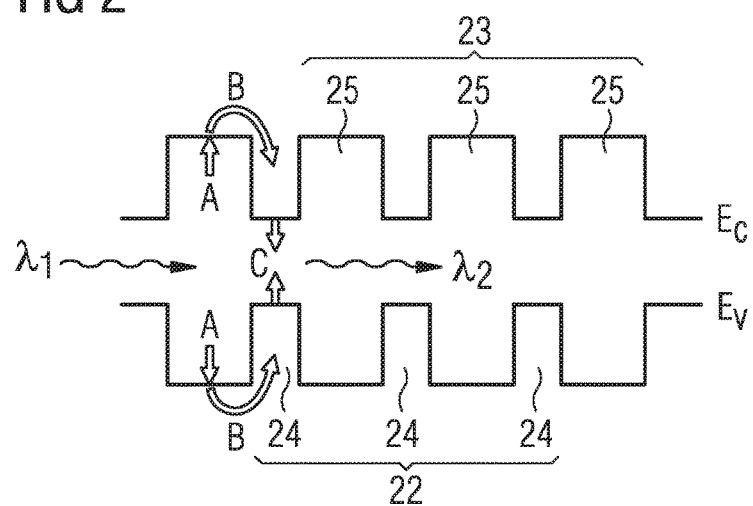
FIGS. 2 and 3 show a schematic view of an exemplified embodiment of the method for generating radiation.
Figure 3:
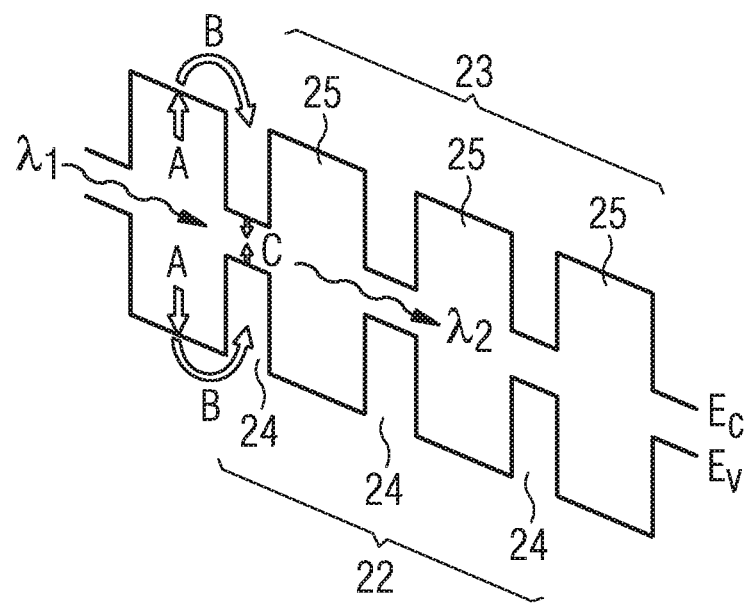

FIGS. 2 and 3 schematically illustrate how radiation of the first wavelength $\lambda_1$ is partly or completely converted into radiation of the second wavelength $\lambda_2$ by means of the semiconductor device and how the wavelength of the radiation generated in the second semiconductor layer sequence can be modified by an electrical field active at that location. The energy level $E_C$ of the valence band and the energy level $E_V$ of the conduction band of the second semiconductor layer sequence 20 are plotted in sections.

As shown in FIG. 2 for the case without the effect of an electrical field, the radiation of the first wavelength $\lambda_1$ generated by the active region is absorbed during operation in the barrier layer structure 23, i.e. in the barrier layers 25, whereby initially charge carrier separation takes place in the barrier layers 25 (step A). The thus separated charge carriers are captured in the lower-energy quantum wells of the quantum well structure 21, i.e. in the quantum layers 24 of the quantum layer structure 22 (step B) and, by recombination, cause at that location the emission of the radiation having the wavelength $\lambda_2$ (step C).

FIG. 3 illustrates the distortion of the energy bands in the quantum well structure occurring under the effect of an electrical field as a result of the quantum-confined Stark effect (QCSE). The energy level $E_C$ of the valence band and the energy level $E_V$ of the conduction band of the second semiconductor layer sequence 20 are superimposed by a linear potential curve in the event of a constant electrical field. This results in a displacement and deformation of the wave functions in the quantum layers 24, which inter alia result in a reduction in the probability of a recombination in the quantum layer and a change, e.g. a decrease, in the wavelength of the radiation generated after a recombination.

Figure 4:
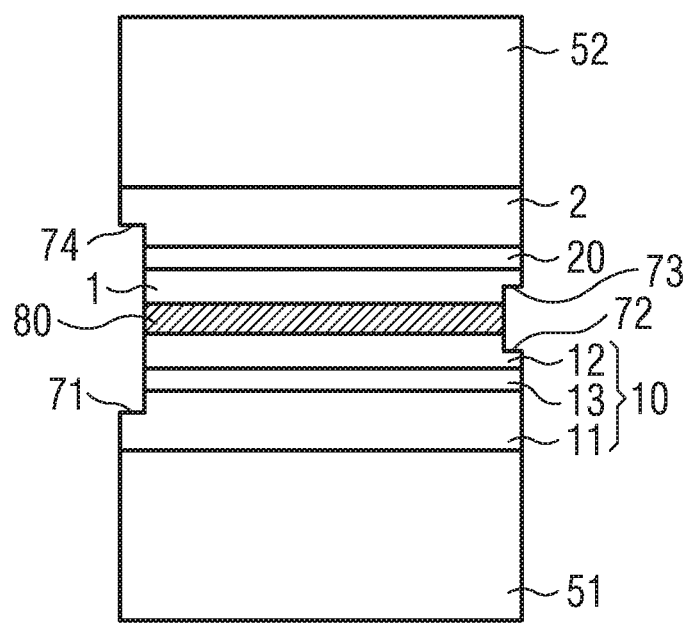
FIG. 4 shows a schematic sectional view of a second exemplified embodiment of the semiconductor device.

A further exemplified embodiment of the semiconductor device is illustrated in FIG. 4. In contrast to the semiconductor device shown in FIG. 1, the first semiconductor layer sequence 10 and the second semiconductor layer sequence 20 are not epitaxially grown one on top of the other, but are attached to one another via a transparent connecting element 80. More precisely, the connecting element 80 establishes a mechanical connection between the second semiconductor layer 12 and the first electrode surface 1. Just like in the preceding exemplified embodiment, the first semiconductor layer 11 of the first semiconductor layer sequence 10 and the second electrode surface 2 consist of n-GaN and the second semiconductor layer 12 of the first semiconductor layer sequence 10 and the first electrode surface 1 consist of p-GaN.

The exemplified embodiment illustrated in FIG. 4 is designed symmetrically; growth substrates 51, 52 are arranged on opposite sides of the semiconductor device 100 and have the first and second semiconductor layer sequence epitaxially grown thereon in each case. However, in other embodiments, not shown, the design deviates from a symmetrical form.

In the present case, the connecting element 80 is formed by an electrically insulating, transparent adhesive. For this reason, the semiconductor device comprises four separate contacts 71, 72, 73, 74 which can be used to apply mutually different voltages to the two semiconductor layer sequences 10, 20.

According to another embodiment, not shown, the connecting element is designed to be electrically conductive at least in regions and establishes an electrically conductive connection between the second semiconductor layer 12 of the first semiconductor layer sequence 10 and the first electrode surface 1. For example, the connecting element can contain or consist of an electrically conductive adhesive. Alternatively, electrically conductive through vias can be provided in the connecting element or electrically conductive bridges can be provided on the sides thereof.

The invention is not limited by the description made with reference to the exemplified embodiments. Rather, the invention encompasses any new feature and any combination of features, including in particular any combination of features in the claims, even if this feature or this combination is not itself explicitly indicated in the claims or exemplified embodiments.

LIST OF REFERENCE NUMERALS

1 First electrode surface
2 Second electrode surface
10 First semiconductor layer sequence
11 First semiconductor layer
12 Second semiconductor layer 13 Active region
20 Second semiconductor layer sequence
21 Quantum well structure
22 Quantum layer structure
23 Barrier layer structure
24 Quantum layers
25 Barrier layers
50 Growth substrate
51, 52 Growth substrates
60 V defects
71-74 Contacts
80 Transparent connecting element
100 Semiconductor device
$\lambda_1$ First wavelength
$\lambda_2$ Second wavelength
$E_C$ Energy level of valence band
$E_V$ Energy level of conduction band
A-C Steps

The invention claimed is:

1. A radiation-emitting semiconductor device having a first semiconductor layer sequence, a second semiconductor layer sequence, a first electrode and a second electrode, wherein
the first electrode is arranged between the first semiconductor layer sequence and the second semiconductor layer sequence and the second semiconductor layer sequence is arranged between the first electrode and the second electrode,
the first semiconductor layer sequence includes a first semiconductor layer, a second semiconductor layer and an active region arranged between the first semiconductor layer and the second semiconductor layer, said active region being designed to generate radiation of a first wavelength,
the second semiconductor layer sequence comprises a quantum well structure having a quantum layer structure and a barrier layer structure and is designed to generate incoherent radiation of a second wavelength by absorbing the radiation of the first wavelength,
an electrical field can be generated in the second semiconductor layer sequence by the first electrode and the second electrode, and
the first semiconductor layer sequence and the second semiconductor layer sequence are integrated monolithically into the semiconductor device,
wherein the first semiconductor layer sequence, the first electrode, the second semiconductor layer sequence, and the second electrode are stacked directly one on top of the other on a substrate.

2. The radiation-emitting semiconductor device according to claim 1, wherein the radiation-emitting semiconductor device comprises a radiation exit surface and the second semiconductor layer sequence is arranged between the first semiconductor layer sequence and the radiation exit surface.

3. The radiation-emitting semiconductor device according to claim 1, wherein the first electrode is transparent at least for radiation of the first wavelength and the second electrode is transparent at least for radiation of the second wavelength.

4. The radiation-emitting semiconductor device according to claim 1, wherein means for limiting a current flowing through the second semiconductor layer sequence are provided between the first electrode and the second electrode.

5. The radiation-emitting semiconductor device according to claim 1, wherein the first electrode or the second electrode is electrically insulated from the second semiconductor layer sequence.

6. The radiation-emitting semiconductor device according to claim 1, wherein the second semiconductor layer sequence includes layers of undoped semiconductor material.

7. The radiation-emitting semiconductor device according to claim 1, wherein the first electrode or the second electrode in each case comprise a doped semiconductor material and have different conductivity types.

8. The radiation-emitting semiconductor device according to claim 1, wherein the second semiconductor layer sequence comprises, on a surface facing the second electrode, a multiplicity of V defects.

9. The radiation-emitting semiconductor device according to claim 8, wherein the V defects are filled with a doped semiconductor material.

10. The radiation-emitting semiconductor device according to claim 1, wherein the second semiconductor layer of the first semiconductor layer sequence is connected to the first electrode in an electrically conductive manner.

11. The radiation-emitting semiconductor device according to claim 1, wherein the first semiconductor layer and the second semiconductor layer of the first semiconductor layer sequence are electrically insulated from the first electrode.

12. The radiation-emitting semiconductor device according to claim 1, wherein the first semiconductor layer sequence and the second semiconductor layer sequence are attached to one another via a connecting element.

13. A method for generating radiation using a radiation-emitting semiconductor device according to claim 1, comprising the steps of:
generating radiation of a first wavelength in the first semiconductor layer sequence; and
at least partly absorbing the radiation of the first wavelength;
generating incoherent radiation of a second wavelength in the quantum layer structure,
wherein the second wavelength is adjusted or adapted by way of a voltage applied between the first electrode and the second electrode.

14. The method according to claim 13, wherein the voltage applied between the first electrode and the second electrode is greater than 1 V.

15. The radiation-emitting semiconductor device according to claim 1, wherein the second semiconductor layer sequence is in direct contact with a first side of the first electrode, a second side of the first electrode is in direct contact with a first side of the first semiconductor layer sequence, and a second side of the first semiconductor layer sequence is in a direct contact with the substrate.

16. The radiation-emitting semiconductor device according to claim 1, wherein the second semiconductor layer sequence is in direct contact with a first side of the first electrode, the radiation-emitting semiconductor device further comprising:
a connecting element,
wherein a second side of the first electrode is in direct contact with a first side of the connecting element, a second side of the connecting element is in direct contact with a first side of the first semiconductor layer sequence.

17. The radiation-emitting semiconductor device according to claim 1, wherein the substrate comprises sapphire.

18. A radiation-emitting semiconductor device having a first semiconductor layer sequence, a second semiconductor layer sequence, a first electrode and a second electrode, wherein the first electrode is arranged between the first semiconductor layer sequence and the second semiconductor layer sequence and the second semiconductor layer sequence is arranged between the first electrode and the second electrode, the first semiconductor layer sequence includes a first semiconductor layer, a second semiconductor layer and an active region arranged between the first semiconductor layer and the second semiconductor layer, said active region being designed to generate radiation of a first wavelength, the second semiconductor layer sequence comprises a quantum well structure having a quantum layer structure and a barrier layer structure and is designed to generate incoherent radiation of a second wavelength by absorbing the radiation of the first wavelength, an electrical field can be generated in the second semiconductor layer sequence by the first electrode and the second electrode, and the first semiconductor layer sequence and the second semiconductor layer sequence are attached to one another via a connecting element, which is arranged between the first semiconductor layer sequence and the second semiconductor layer sequence, wherein the first semiconductor layer sequence, the second semiconductor layer sequence, the first electrode and the second electrode are stacked on top of one another on a substrate; and the second semiconductor layer sequence is in direct contact with a first side of the first electrode, a second side of the first electrode is in direct contact with a first side of the connecting element, and a second side of the connecting element is in direct contact with a first side of the first semiconductor layer sequence.

19. The radiation-emitting semiconductor device according to claim 18, wherein the connecting element is arranged between the first semiconductor layer sequence and the second semiconductor layer sequence.

20. The radiation-emitting semiconductor device according to claim 18, wherein the second semiconductor layer sequence is designed such that the second wavelength is adjustable or adaptable by way of the electrical field generated by the first electrode and the second electrode.

21. The radiation-emitting semiconductor device according to claim 18, wherein the substrate comprises sapphire.

* * * * *